(12) United States Patent
Ohtani et al.

(10) Patent No.: US 7,749,819 B2
(45) Date of Patent: Jul. 6, 2010

(54) METHOD FOR MANUFACTURING SEMICONDUCTOR DEVICE

(75) Inventors: Hisashi Ohtani, Kanagawa (JP); Akiharu Miyanaga, Kanagawa (JP); Hongyong Zhang, Kanagawa (JP); Naoaki Yamaguchi, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 88 days.

(21) Appl. No.: 11/808,035

(22) Filed: Jun. 6, 2007

(65) Prior Publication Data

US 2008/0020554 A1 Jan. 24, 2008

Related U.S. Application Data

(60) Division of application No. 10/952,774, filed on Sep. 30, 2004, now Pat. No. 7,235,828, which is a division of application No. 08/807,737, filed on Feb. 27, 1997, now Pat. No. 6,884,698, which is a continuation of application No. 08/479,211, filed on Jun. 7, 1995, now abandoned, which is a continuation-in-part of application No. 08/391,580, filed on Feb. 21, 1995, now Pat. No. 5,605,846.

(30) Foreign Application Priority Data

Feb. 23, 1994 (JP) .................................. 6-51237

(51) Int. Cl.
H01L 21/00 (2006.01)
H01L 21/84 (2006.01)
(52) U.S. Cl. ................. 438/151; 438/149; 257/E21.409
(58) Field of Classification Search .................. 438/487, 438/149, 151; 257/72, 70
See application file for complete search history.

(56) References Cited

U.S. PATENT DOCUMENTS 3,108,914 A  10/1963  Hoerni (Continued)

FOREIGN PATENT DOCUMENTS

JP  56-24925  3/1981

(Continued)

OTHER PUBLICATIONS

C. Hayzelden et al., "*In Situ Transmission Electron Microscopy Studies of Silicide-Mediated Crystallization of Amorphous Silicon*," Applied Physics Letters, 1992, vol. 60, No. 2, pp. 225-227.

(Continued)

*Primary Examiner*—Phat X Cao
*Assistant Examiner*—Nga Doan
(74) *Attorney, Agent, or Firm*—Nixon Peabody LLP; Jeffrey L. Costellia

(57) ABSTRACT

It is an object to obtain a crystalline silicon film having preferable characteristics for a thin film transistor.

A crystalline silicon film having improved crystallinity is obtained by the following steps: forming a silicon nitride film substantially in contact with an amorphous silicon film on glass substrate; introducing a catalyst element such as nickel; performing an annealing treatment at a temperature of 500 to 600° C. for crystallization; and further irradiating it with a laser light, thereby a crystalline silicon film having improved crystallinity can be obtained. By using the crystalline silicon film thus obtained, a semiconductor device such as a TFT having improved characteristic can be obtained.

20 Claims, 4 Drawing Sheets

U.S. PATENT DOCUMENTS

| | | | |
|---|---|---|---|
| 3,389,024 | A | 6/1968 | Schimmer |
| 3,783,049 | A | 1/1974 | Sandera |
| 3,791,883 | A | 2/1974 | Takei et al. |
| 3,988,762 | A | 10/1976 | Cline et al. |
| 4,068,020 | A | 1/1978 | Reuschel |
| 4,309,224 | A | 1/1982 | Shibata |
| 4,330,363 | A | 5/1982 | Biegesen et al. |
| 4,379,020 | A | 4/1983 | Glaeser et al. |
| 4,472,458 | A | 9/1984 | Sirinyan et al. |
| 4,502,204 | A | 3/1985 | Togashi et al. |
| 4,746,628 | A | 5/1988 | Takafuji et al. |
| 4,766,477 | A | 8/1988 | Nakagawa et al. |
| 4,851,363 | A | 7/1989 | Troxell et al. |
| 4,911,781 | A | 3/1990 | Fox et al. |
| 4,915,772 | A | 4/1990 | Fehlner et al. |
| 5,010,033 | A | 4/1991 | Tokunaga et al. |
| 5,075,259 | A | 12/1991 | Moran |
| 5,108,843 | A | 4/1992 | Ohtaka et al. |
| 5,130,103 | A | 7/1992 | Yamagata et al. |
| 5,147,826 | A | 9/1992 | Liu et al. |
| 5,166,091 | A * | 11/1992 | Lifshitz et al. ............ 438/152 |
| 5,219,786 | A | 6/1993 | Noguchi |
| 5,244,836 | A | 9/1993 | Lim |
| 5,272,361 | A | 12/1993 | Yamazaki |
| 5,273,920 | A | 12/1993 | Kwasnick et al. |
| 5,275,851 | A | 1/1994 | Fonash et al. |
| 5,278,093 | A | 1/1994 | Yonehara |
| 5,289,030 | A | 2/1994 | Yamazaki et al. |
| 5,306,651 | A | 4/1994 | Masumo et al. |
| 5,311,041 | A | 5/1994 | Tominaga et al. |
| 5,352,291 | A | 10/1994 | Zhang et al. |
| 5,354,697 | A | 10/1994 | Oostra et al. |
| 5,358,907 | A | 10/1994 | Wong |
| 5,387,530 | A | 2/1995 | Doyle et al. |
| 5,403,772 | A | 4/1995 | Zhang et al. |
| 5,424,244 | A | 6/1995 | Zhang et al. |
| 5,426,064 | A | 6/1995 | Zhang et al. |
| 5,481,121 | A | 1/1996 | Zhang et al. |
| 5,501,989 | A | 3/1996 | Takayama et al. |
| 5,508,533 | A | 4/1996 | Takemura |
| 5,529,937 | A * | 6/1996 | Zhang et al. ............ 438/471 |
| 5,569,936 | A | 10/1996 | Zhang et al. |
| 5,605,846 | A | 2/1997 | Ohtani et al. |
| 5,608,232 | A | 3/1997 | Yamazaki et al. |
| 5,639,698 | A | 6/1997 | Yamazaki et al. |
| 5,643,826 | A | 7/1997 | Ohtani et al. |
| 5,646,424 | A | 7/1997 | Zhang et al. |
| 5,696,003 | A * | 12/1997 | Makita et al. ............ 438/166 |
| 5,710,050 | A | 1/1998 | Makita et al. |
| 5,773,327 | A | 6/1998 | Yamazaki et al. |
| 5,843,225 | A | 12/1998 | Takayama et al. |
| 5,849,043 | A | 12/1998 | Zhang et al. |
| 5,888,857 | A | 3/1999 | Zhang et al. |
| 6,358,784 | B1 | 3/2002 | Zhang et al. |
| 6,655,767 | B2 | 12/2003 | Zhang et al. |
| 2003/0122131 | A1 | 7/2003 | Zhang et al. |
| 2004/0115940 | A1 | 6/2004 | Zhang et al. |

FOREIGN PATENT DOCUMENTS

| | | |
|---|---|---|
| JP | 57-194518 | 11/1982 |
| JP | 60-105216 | 6/1985 |
| JP | 62-030314 | 2/1987 |
| JP | 63-142807 | 6/1988 |
| JP | 63-299321 | 12/1988 |
| JP | 64-015983 | 1/1989 |
| JP | 02-140915 | 5/1990 |
| JP | 03-034461 | 2/1991 |
| JP | 03-095939 | 4/1991 |
| JP | 3-280420 | 12/1991 |
| JP | 04-11722 | 1/1992 |
| JP | 05-067635 | 3/1993 |
| JP | 05-211334 | 8/1993 |
| JP | 05-326430 | 12/1993 |
| JP | 06-013610 | 1/1994 |
| JP | 06-267978 | 9/1994 |

OTHER PUBLICATIONS

John L. Vossen and Werner Kern, "*Plasma-Enhanced Chemical Vapor Deposition,*" Thin Film Processes II, 1991, pp. 537-541.

Hempel, et al., "Needle-Like Crystallization of Ni Doped Amorphous Silicon Thin Films", Solid State Communications, 1993, vol. 85, No. 11, pp. 921-924.

Hayzelden et al., "Transport Electron Microscopy Studies of Silicide-Mediated Crystallization of Amorphous Silicon", Applied Physics Letters, 1991, vol. 85, No. 2, pp. 225-227.

Dvurechenskii et al., *Transport Phenomena in Amorphous Silicon Doped by Ion Implantation of 3d Metals*, Phys. Stat. Sol. (a), 1986, vol. 95, pp. 635-640.

Yunosuke Kawazu et al.,"Low-Temperature Crystallization of Hydrogenated Amorphous Silicon Induced by Nickel Silicide Formation", Institute of Applied Physics, University of Tsukuba, pp. 2698-2704 (Dec. 1990).

T.I. Kamins,"Design Properties of Polycrystalline Silicon", Sensors and Actuators, A21-A23, (1990) pp. 817-824.

Wolf, Silicon Processing for the VLSI Era Volume 2: Process Integration, 1990, Lattice Press, p. 274.

S.M. Sze, VLSI Technology, second edition, p. 85,86,266,267, 1988.

Sorab K. Ghandhi, VLSI Fabrication Principles, second edition, p. 484,485,533-535, 1994.

B.C. Ahm et al., "Batch-Processing of High-Performance Amorphous-Silicon/Silicon Nitride Thin-Film Transistors", Oct. 1991, IEEE Display Research Conference, pp. 85-88.

Sera et al., "High-Performance TFTs Fabricated by XeCl Excimer Laser Annealing of Hydrogenated Amorphous-Silicon Film", 1989, IEEE Transactions on Electron Devices, vol. 36, No. 12, pp. 2868-2872.

Zhang et al., "KrF Excimer Laser Annealed TFT with Very High Field-Effect Mobility of 329 cm2/Vs", 1992, IEEE Electron Device Letters, vol. 13, No. 5, pp. 297-299.

Murarka, "Silicides for VLSI Applications", pp. 82 and 112, 1993.

Stoemenos et al., "Crystallization of Amorphous Silicon by Reconstructive Transformation Utilizing Gold", Appl. Phys. Lett. vol. 58, No. 11, Mar. 18, 1991, pp. 1196-1198.

Hayzelden et al., "Silicide Formation and Silicid-Mediated Crystallization of Nickel-Implanted Amorphous Silicon Thin Films", J. Appl. Phys., vol. 73, No. 12, Jun. 15, 1993, pp. 8279-8289.

Kuznetsov et al., "Enhanced Solid Phase Epitaxial Recrystallization of Amorphous Silicon due to Nickel Silicide Precipitation Resulting from Ion Implantation and Annealing", Nuclear Instruments and Methods in Physics Research B80/81, (1993), pp. 990-993.

Kawazu et al., "Initial Stage of the Interfacial Reaction between Nickel and Hydrogenated Amorphous Silicon", Japanese Journal of Applied Physics, vol. 29, No. 4, Apr. 1990, pp. 729-738.

Batstone et al., "Microscopic Processes in Crystallization", Solid State Phenomena, vols. 37-38, (1994), pp. 257-268.

Y. Kawazu et al., Jpn. J. Appl Phys, 29, 12 (1990) pp. 2698-2704, "Low-Temperature Crystallization of Hydrogenated Amorphous Silicon Induced by Nickel Silicide Formation".

T. Sato et al., Physical Review B, Vo. 4, No. 6, 1971, pp. 1950-1960, "Mobility Anisotropy of Electrons in Inversion Layers on Oxidized Silicon Surfaces".

Tamura et al., "Oriented Crystal Growth of Si on SiO2 Patterns by Pulse Ruby Laser Annealing", Proceedings of the 12th Conference on Solid State Device, Tokyo, (1980), pp. 43-48.

H.R. Wenk et al., "Texture Analysis of Polycrystalline Silicon Films", J. Appl. Phys., 67 (1), Jan. 1, 1990, pp. 572-574.

T.I. Kamins, "Design Properties of Polycrystalline Silicon", Sensors and Actuators, A21-A23, (1990), pp. 817-824.

Nagarajan Sridhar et al., "Polysilicon films of high photoresponse, obtained by vacuum annealing of aluminum capped hydrogenated amorphous silicon", J. Appl. Phys., 78, (12), pp. 7304-7312, (Dec. 15, 1995).

T. Noma et al., "Crystal forms by solid-state recryallization of amorphous Si films", Appl. Phys. Lett., 59 (6), pp. 653-655, (Aug. 5, 1991).

R. Kakkad et al., "Crystallized Si films by Low-temperature rapid thermal annealing of amorphous silicon" J.Appl. Phys., 65(5), Mar. 1, 1989, pp. 2069-2072.

G. Liu et al., "Polycrystalline silicon thin film transistors on Corning 7059 glass substrates using short time, Low-temperature processing," Appl. Phys. Lett. 62(20), May 17, 1993, pp. 2554-2556.

G. Liu et al., "Selective area crystallization of amorphous silicon films by low-temperature rapid thermal annealing," Appl. Phys. Lett. 55(7), Aug. 14, 1989, pp. 660-662.

R. Kakkad et al., "Low Temperature Selective Crystallization of Amorphous Silicon" Journal of Non-Crystalline Solids, 115, 1989, pp. 66-68.

L. Hultman, A. Robertsson and H.T.G. Hentzell, "Crystallization of Amorphous Silicon During Thin-Film Gold Reaction" J. Appl. Phys. 62 (9), pp. 3647-3655, Nov. 1, 1987.

Hiroyuki Kuriyama, et al. "Comprehensive Study of Lateral Grain Growth in Poly-Si Films by Excimer Laser Annealing and Its Application to Thin Film Transistors" Jpn. J. Appl. Phys., vol. 33 (1994), pp. 5657-5662 (Oct. 10, 1994).

S. Caune et al. Appl. Surf. Sci., 36 (1989) 597-604, "Combined CW laser and furnace annealing of amorphous Si and Ge in contact with some metals", 1989.

M. Fuse et al., Solid State Phenomena, 37-38 (1994) 565-570, "Performance of poly-si TFTs fabricated by excimer laser annealing . . . with or without solid phase crystallization", 1994.

B.C. Ahn et al., "Batch-Processing of High-Performance Amorphous-Silicon/Silicon Nitride Thin-Film Transistors", Oct. 1991, International Display Research Conference, pp. 85-88.

Hiroyuki Kiriyama, et al. "Comprehensive Study of Lateral Grain Growth in Poly-Si Films by Excimer Laser Annealing and Its Application to Thin Film Transistors" Jpn. J. Appl. Phys., vol. 33 (1994) No. 10, pp. 5657-5662 (Oct. 10, 1994).

S.M. Sze, "Silicon on Insulators," VLSI Technology, second edition, pp. 85-86, 266-267, 1988.

Sorab K. Ghandhi, "Thermal Oxidation of Gallium Arsenide," VLSI Fabrication Principles Silicon and Gallium Arsenide, second edition, pp. 484, 485, 533-535, 1994.

Murarka, "Silicides for VLSI Applications", pp. 82 and 112, 1983.

T. Noma et al., "Crystal forms by solid-state recrystallization of amorphous Si films on $SiO_2$", Applied Physics Letters, vol. 59(6), pp. 653-655 (Aug. 5, 1991).

R. Kakkad et al., "Crystallized Si films by Low-temperature rapid thermal annealing of amorphous silicon" J.Appl.Phys., 65(5), Mar. 1, 1989, pp. 2069-2072.

B.C. Ahn et al., "Batch-Processing of High-Performance Amorphous-Silicon/Silicon Nitride Thin-Film Transistors", Oct. 1991, Conference Record of the 1991 International Display Research Conference, pp. 85-88.

* cited by examiner

METHOD FOR MANUFACTURING SEMICONDUCTOR DEVICE

This application is a Divisional of application Ser. No. 10/952,774 filed Sep. 30, 2004, now U.S. Pat. No. 7,235,828 now issued which is a Divisional of application Ser. No. 08/807,737 filed Feb. 27, 1997, now U.S. Pat. No. 6,884,698 now Issued which is a Continuation of application Ser. No. 08/479,211 filed Jun. 7, 1995, now abandoned which is a Continuation-In-Part of application Ser. No. 08/391,580 filed Feb. 21, 1995, now U.S. Pat. No. 5,605,846 now Issued

DETAILED DESCRIPTION OF THE INVENTION

1. Field for Industrial Use

The present invention relates to a method for manufacturing a semiconductor comprising silicon having crystallinity as a main component. The silicon semiconductor obtained according to the method of the present invention can be used in thin film transistors and the like.

2. Prior Art

Thin film transistors utilizing a semiconductor thin film (referred to hereinafter as TFTs) has been well known. The TFTs are composed by utilizing the thin film semiconductor formed on a substrate. The TFTs are used in various types of integrated circuits, and are particularly suitable in the field of electro-optical devices such as liquid crystal displays; more specifically, as switching elements provided for each of the pixels in an active matrix type liquid crystal display device as well as the driver elements formed on peripheral circuits portion.

An amorphous silicon film can be utilized most readily as a thin film semiconductor used for the TFTs, however, there is a problem that electrical characteristics of the amorphous silicon film are poor. To improve the characteristic of TFTs, it is preferred to use a silicon thin film having crystallinity. The crystalline silicon film can be prepared by first forming an amorphous silicon film and then heat treating of the film to crystallize it. Otherwise, high energy electromagnetic waves such as a laser beam may be irradiated.

Problems to be Solved by the Invention

However, it is required to take 10 hours or longer for a crystallization by heating at a heating temperature of 600° C. or higher, so that there is a problem that it is difficult to use a glass substrate as a substrate. For example, Corning 7059 glass used for active matrix type liquid crystal display devices, has a glass distortion point of 593° C. so that there is a problem to heat a substrate at a temperature of 600° C. or higher in the case of using a substrate having large area. Further, the crystalline silicon film thus obtained is inferior in characteristic in comparison with one obtained by laser light irradiation.

To solve the problem, an element having such a catalytic function that enhances the crystallinity of an amorphous silicon may be used. Namely, it was found that a trace amount of nickel or palladium, or other elements such as lead is deposited in contact with the amorphous silicon film and then applying a heat treatment at the temperature of 600° C. or less, typically 550° C. for about four hours for crystallization. However, it was found that the characteristic of the silicon film obtained by this method conducted at a lower temperature for short duration was not suitable.

On the other hand, it was a problem to form a crystalline silicon film by irradiating laser light or the like, from practical point of view. The silicon film obtained by this method was suitable for use in the fabrication of a TFT since it yields superior characteristics (for example, high field mobility, low S value, and low threshold voltage). However, the crystallinity of the silicon film thus obtained strongly depends on the energy of the laser. Due to the instability of laser energy, it is very difficult to obtain a crystalline silicon film with a high reliability.

Further, in the case of crystallizing an amorphous silicon film with a silicon oxide in contact therewith, the silicon film tends to be oriented along (111) plane. A TFT having a channel forming region by using the (111) plane tends to have a threshold voltage $V_{th}$ shifted to a negative value due to the large positive fixed charges. Therefore, it will be obstacle in the case of constructing a complementary circuit composed of an N-channel TFT and a P-channel TFT. Accordingly, in order to control the shift in the threshold voltage, the silicon film must be fabricated so as not to orient along the (111) plane.

In view of the above-described condition, the present invention has an object to provide a silicon film having high crystallinity (that is, improved characteristic), which is not oriented along the (111) plane with a high reliability.

Means to Solve the Problem

In order to attain the above object, the present invention provides a silicon film having a crystallinity by using the process as follows.

First, a silicon nitride film is formed in contact with an amorphous silicon film. As a silicon nitride film, the preferred nitrogen/silicon ratio was from 1.3 to 1.5 ($1.3 \leq x \leq 1.5$). If the ratio x is lower than 1.3, the film tends to trap the charge, and is not suitable for forming a semiconductor device. The electrical characteristics of the film can be improved by adding hydrogen or oxygen to the film at 0.01-2% to bury dangling bond. In such a case, the silicon nitride film can be expressed by one of the formulas $SiN_xH_y$, $SiO_xN_y$, and $SiO_xN_yH_z$. The silicon nitride according to the present invention includes hydrogenated silicon nitride, and a silicon oxynitride.

The use of a silicon nitride film prevents the crystallinity of the amorphous silicon film from being oriented along the (111) plane. Namely, since crystallized silicon oxide has a diamond structure as a silicon film does, a silicon film tends to be oriented along one plane, that is, the (111) plane due to the boundary energy between the silicon films and the silicon oxide. On the other hand, crystallized silicon nitride is cubic, and the matchability with a silicon film is not always good. Thus, the amorphous silicon film can be crystallized without orienting along the one plane.

On the other hand, single catalyst element or a compound including the catalyst element, which is capable of promoting the crystallization of an amorphous silicon film, is disposed in contact with the amorphous silicon film in a layer-like form, a film-like form, or a cluster-like form. The single catalyst element or compound layer including the catalyst element will be referred to simply as "a catalyst layer" hereinafter.

The use of nickel as the catalyst element for promoting the crystallization is particularly effective in the process according to the present invention. However, as other kinds of useful catalyst elements, platinum (Pt), copper (Cu), silver (Ag), gold (Au), indium (In), tin (Sn), palladium (Pd), phosphorus (P), arsenic (As), and antimony (Sb) can be considered. Otherwise, the catalyst element may be selected from a kind of or several kinds of the elements belonging to Groups VIII, IIIb, IVb, and Vb.

The order listed below may be changed arbitrarily. As a construction of the process, the following four patterns may be considered:

(1) Forming the layers in the order of silicon nitride film, amorphous silicon film, and catalyst layer;

(2) Forming the layers in the order of silicon nitride film, catalyst layer, and amorphous silicon film;

(3) Forming the layers in the order of catalyst layer, amorphous silicon film, and silicon nitride film; and (4) Forming the layers in the order of amorphous silicon film, catalyst layer, and silicon nitride film; and (5) Forming the catalyst layer, on a part of the amorphous silicon film, and a silicon nitride film on the other part of the amorphous silicon film.

In the above examples (1) to (4), there is no need to cover the entire surface of the amorphous silicon film with a silicon nitride film and the catalyst layer. In the examples (2) and (4) mentioned above, the amorphous silicon film and the silicon nitride film seem to be not in direct contact with each other, however, since the thickness of the catalyst layer is very thin, the amorphous silicon film is substantially in contact with the silicon nitride in the above described construction.

Thereafter, the amorphous silicon film is subjected to heat treatment to crystallize one part or the whole part of the amorphous silicon film. Also, in the process, an amorphous silicon regions in grain shape may be left in the silicon film. That is, crystallization of the silicon film does not need to occur over the entire, surface of the amorphous silicon film. Moreover, when the catalyst layer is provided only on a part of the amorphous silicon film in this crystallization process, crystallization proceeds from the region covered by the catalyst layer to the periphery thereof.

Then, the crystallization is further promoted by irradiating it with laser beam or intense light beam equivalent thereto. In the process, a part of the crystallized regions and other part wherein crystallization did not occur by the previous heating treatment are melted. However, the other part of the crystallized regions remains without melting so that this part functions as nuclei and the crystallization proceeds rapidly toward the periphery of the silicon film. The above mentioned amorphous silicon region in the grain form is crystallized by this process.

Although the degree of crystallization (i.e. the area ratio of the crystallized region with respect to the entire area, as observed through a microscope) after heat treatment process is changeable due to the concentration of element, thermal treatment time or the like, it is generally in the range of from 20 to 90%. The maximum attainable amount of crystallization is about 97% by raising the heating temperature. However, the proportion of the amorphous component can be more effectively reduced to a negligible degree by irradiation of the above laser beam or intense light beam equivalent thereto.

This process is essentially different from a conventional one. Namely, according to the conventional crystallization by irradiating laser light, an amorphous silicon film having no nucleating site is melted and then crystallized so that the condition for determining crystallinity is very strict. In other words, in the absence of nucleating site, it is the cooling rate that mainly determines the crystallinity, however, the cooling rate differs depending upon the energy density of the laser light or the surrounding temperature. Therefore, the optimum laser energy density is naturally limited to a narrow range. If the energy density is too high, the cooling rate from the melt condition becomes too rapid and leaves an amorphous state in the obtained film. If the energy is too low, the film cannot be wholly melted and leaves amorphous portions.

In contrast to the above conventional laser process, crystallization in the process according to the present invention can be more readily effected because of a crystal nucleus, and the crystallization process is less dependent on the cooling rate. Further, since a large part of the film is crystallized, the film characteristics can be assured to a certain degree even if a low energy density laser is used. Accordingly, a crystallized silicon film having fine crystallinity can be formed with a high, reliability. The characteristic of the crystallized silicon film obtained by the present invention is inferior a little in comparison with the best one of conventional crystallized silicon films formed by laser irradiation, however, it can be formed with a high reliability. Therefore, the average characteristic is much better to conventional one formed by laser irradiation.

Instead of using a laser beam, non-coherent intense light, particularly infrared radiation, may be used for a short period of time. The infrared radiation is difficult to be absorbed by glass, but is readily absorbed by a silicon thin film. Accordingly, it is preferable that the silicon thin film formed on a glass substrate can be heated selectively. This process of radiating infrared light for a short period of time is called as rapid thermal annealing (RTA) or a rapid thermal process (RTP).

As a method of introducing catalyst element for promoting a crystallization, a deposition process such as sputtering of the single catalyst element or a compound of the element, using a vacuum deposition apparatus. In an alternative, a deposition process can be effected in the atmosphere by coating the surface of the amorphous silicon film with a solution containing the catalyst element. The latter process is particularly advantageous in terms of the reproducibility of the process without making an investment of a lot of money in the equipment expansion. The later process is described in further detail below.

In the case of using the latter process, the solution for use can be an aqueous solution, a solution based on an organic solvent, or the like. In the specification, "include" has both meanings that a thing is included in the form of a compound and things are included by simply dispersion.

As the solvent including the catalyst element, it may be selected from various types of polar solvents such as water, alcohol, acid, or ammonia water.

When nickel is used as the catalyst, it may be added to the polar solvent in the form of a nickel compound. As the typical nickel compound, it may be selected from a group of nickel bromide, nickel acetate, nickel oxalate, nickel carbonate, nickel chloride, nickel iodide, nickel nitrate, nickel sulfate, nickel formate, nickel acetylacetonate, nickel 4-cyclohexyl-butyrate, nickel oxide, and nickel hydroxide.

Otherwise, as a solvent including a catalyst element, a non-polar solvent selected from benzene, toluene, xylene, carbon tetrachloride, chloroform, and ether can be used. In this case again, nickel is introduced in the form of a nickel compound. Typical nickel compounds may be selected from nickel acetylacetonate and nickel 2-ethylhexanoate.

It is also useful to add a surface active agent (surfactant) to the solution containing a catalyst element. The surface active agent increases adhesion to the surface of the substrate onto which the amorphous silicon is deposited and controls adsorption. The surfactant may be applied previously to the surface of the substrate onto which the amorphous silicon is deposited.

In the case of using a single nickel as the catalyst element, it must be dissolved in an acid to provide a solution.

The description above is for an example where the catalyst element, nickel is completely dissolved in a solution. However, if nickel is not completely dissolved in the solution, other materials like an emulsion in which single nickel or a compound of nickel is dispersed in the form of a powder in a dispersant may be used. It is also possible to use a solution for forming an oxide film. A preferred example of the solution is OCD (Ohka Diffusion Source) manufactured by Tokyo Ohka Kogyo Co., Ltd. By applying the OCD solution, a silicon oxide film can be easily obtained by applying the OCD to the surface to be coated, and baking it at about 200° C. Since an impurity can be readily added to the solution, the OCD can be utilized in the present invention.

Also, the above mentioned matter is applied to the case of using other material except for nickel as a catalyst element in a similar way.

Although the concentration of the catalyst element including in the solution depends on the kind of the solution, roughly speaking, it is preferable to include the nickel at a concentration from 0.1 to 200 ppm, and preferably from 1 to 50 ppm (weight conversion) in the solution. The concentration is determined based on the nickel concentration in or the chemical resistance (for example, against hydrofluoric acid) of the film after crystallization.

Further, crystal growth can be selectively progressed by applying the solution containing the catalyst element selectively. Particularly in this case, crystals can be grown approximately in parallel with the plane of the silicon film from the region onto which the solution is applied to the region onto which the solution is not applied. The region in which the crystals are grown approximately in parallel with the plane of the amorphous silicon film is referred to hereinafter as a lateral growth region.

It is confirmed that the lateral growth region contains the catalyst element at a lower concentration. Although it is useful to utilize a crystalline silicon film as an active layer region for a semiconductor device, in general, the lower concentration of the impurity in the active region is preferable. Accordingly, it is advantageous in manufacturing the device to employ the lateral growth region in order to form an active region of a semiconductor device.

EXAMPLE

Example 1

FIG. 1 shows the present embodiment. First, a silicon nitride film 102 having a thickness from 1,000 to 5,000 Å, for example, 2000 Å is formed as a base film on a substrate 101 (Corning 7059 glass substrate, 100 mm×100 mm in size and 1.1 mm in thickness). The silicon nitride film 102 may be deposited by sputtering or plasma CVD. The stoichiometric ratio of nitrogen and silicon in a silicon nitride film of the present embodiment (nitrogen/silicon) was set to 1.3 to 1.35, preferably 1.32 to 1.34.

Then, an amorphous silicon film 103 was deposited to a thickness of 100 to 1,500 Å, for example, 800 Å by plasma CVD or LPCVD.

Thereafter, a silicon oxide film 104 as a mask was formed to a thickness of 500 to 3,000 Å, for example, 1,000 Å. Then, holes were perforated selectively in the silicon oxide film to expose the amorphous silicon film.

The amorphous silicon film was immersed in an aqueous hydrogen peroxide solution to form an extremely thin silicon oxide film (not shown in the figure) having a thickness of 10 to 100 Å on the exposed portions of the amorphous silicon film. However, due to its extreme thinness, the accurate thickness of the silicon oxide film was unknown. As an additional method of forming such thin oxide film, oxidation reaction may be used by an ultraviolet (UV) light irradiation in an oxygen atmosphere. In this case, the surface may be exposed to an UV light in an oxygen atmosphere for 1 to 15 minutes. It is also possible to employ thermal oxidation.

The silicon oxide film was provided with the purpose of spreading the acetate solution containing nickel, which is to be applied in a later step, over the entire surface of the amorphous silicon film uniformly. That is, the oxide film was provided for improving the wettability of the amorphous silicon film. If the aqueous acetate solution were to be applied directly onto the surface of the amorphous silicon film, the solution tends to be repelled by the amorphous silicon so that the nickel can not be introduced to the entire surface of the amorphous silicon film, resulting in that the uniformity of the crystallinity would be hindered. In order to reduce the water repellent of the amorphous silicon film, such thin silicon oxide film is formed according to the present process.

Next, an aqueous acetate solution containing nickel at a concentration of 100 ppm was prepared. Then, 2 milliliters of the acetate solution was dropped onto the whole surface and maintained as it is for a duration of 5 minutes. Spin drying is conducted by using spinner (2,000 rpm, for 60 seconds) thereafter.

The amorphous silicon film coated with the solution above was kept as it is for a duration of 1 to 10 minutes thereafter. Although the final concentration of nickel in the amorphous silicon film can be controlled by changing this duration, the most influential factor was the concentration of the solution.

This step of applying the nickel solution was repeated one to several times, whereby a nickel-containing layer (catalyst layer) 105 having an average thickness of from several Å to several hundred Å was obtained, on the exposed surface of the amorphous silicon film 103 after spin drying. In this case, the nickel in the layer will diffuse into the amorphous silicon film during a heat treatment in later process and will functions as a catalyst for promoting crystallization. Also, the catalyst layer is not always a complete film. (FIG. 1(A))

Then a heat treatment is conducted at a temperature of 500 to 600° C., e.g. 550° C. for a duration of 1 to 12 hours, e.g. 8 hours in a nitrogen atmosphere using a furnace. As a result, crystallization proceeds from the opening in the silicon oxide film 104 to form, the crystallized silicon regions 106 and 107. The other regions 108 and 109 remained in an amorphous state. (FIG. 1(B))

A plane view of the structure of FIG. 1(B) is shown in FIG. 2(A). It can be seen that the crystallized region extends from the opening region to an oval region. (FIG. 2(A))

Then, the silicon oxide film 104 was removed and also, the silicon film 103 is patterned and etched into silicon film regions 110 and III in an island-shape. The etching of the silicon film regions was performed by means of an RIE method which is perpendicularly anisotropic. These regions will be an active layer of TFTs. Thereafter, a very thin silicon oxide film 112 was formed to a thickness of 100 Å or less on the surface of the silicon islands 110 and 111 by a heat treatment in an oxygen atmosphere at 550° C.

Next, the crystallinity of the island-like regions 110 and 111 was further improved by irradiation using a KrF excimer laser (a wavelength of 248 nm and a pulse width of 30 nsec), which provides several shots per site with an energy density of from 200 to 400 mJ/cm$^2$, for example, 300 mJ/cm$^2$, in a nitrogen atmosphere or in the air. Instead of using a KrF excimer laser, other types of excimer lasers such as an XeCl laser (wavelength of 308 nm), an ArF laser (193 nm), or an XeF laser (353 nm) may be used. Also, a rapid thermal annealing (RTA) process may be employed. (FIG. 1(C))

Thereafter, a silicon oxide film 113 having a thickness of 1,000 Å was deposited as a gate insulating film by sputtering or by plasma CVD. When sputtering is employed, silicon oxide is used as a target, the substrate temperature is in the range of from 200 to 400° C., for example at 350° C., and the sputtering gas comprises a mixture of oxygen and argon at an argon to oxygen ratio ($Ar/O_2$) of 0 to 0.5, preferably, 0.1 or less. (FIG. 1(D))

Subsequently, a silicon film (phosphorus is included at 0.1-2%) was deposited to a thickness of 3,000 to 8,000 Å, for example, 6000 Å, through reduced pressure CVD. It is desirable to form the silicon film successively following the formation of the silicon oxide film 113. The silicon film was then patterned to provide gate electrodes 114 to 116. A planar view of the process is shown in FIG. 2(B). The oval area defined by the broken lines corresponds to the regions 106 and 107 shown in FIG. 2(A). (FIG. 2(B))

Then, by means of ion doping, impurities (phosphorus and boron) were implanted into the active layer using the gate electrodes 114 to 116 as masks. In the present example, phosphine ($PH_3$) and diborane ($B_2H_6$) was used as the doping gas by applying an acceleration voltage of 60 to 90 kV, for example 80 kV, of 40 to 80 kV, e.g. 65 kV, respectively. The dose amount was in the range of from $1\times10^{14}$ to $8\times10^{15}$ $cm^{-2}$, for example, phosphorus was implanted at a dose of $1\times10^{15}$ $cm^{-2}$, and boron was implanted at a close of $2\times10^{15}$ $cm^{-2}$. At the doping, the elements were each selectively doped by covering the portions in which doping is unnecessary with a photoresist. Thus were obtained N-type impurity regions 118 and 119, and P-type impurity regions 117.

Thereafter, annealing was performed by a laser beam to activate ion-implanted impurities. As the laser beam, a KrF excimer laser (wave-length of 248 nm and a pulse width of 20 nsec) was used, however, it is possible to use other laser beam. The condition of the laser irradiation was 2 to 10 shots per site, for example, 2 shots per site, at an energy density of 200 to 400 $mJ/cm^2$, for example 250 $mJ/cm^2$. Furthermore, it was possible to improve the uniformity in resistance if the substrate was heated at 200-450° C. during the laser irradiation. Because nickel was diffused among the previously crystallized region by the laser annealing process, the recrystallization is easily proceeded by the laser irradiation and an impurity region 117 doped with a P-type impurity and impurity regions 118 and 119 doped with an N-type impurity were easily activated. (FIG. 1(E))

Subsequently, a silicon oxide film 120 having a thickness of 6,000 Å was deposited by plasma CVD as an interlayer insulator. Further, an ITO film having a thickness of 500 Å was deposited by sputtering, and patterned to provide a pixel electrode 121. Then, contact holes were formed on the interlayer insulator 120 (position of the contact holes is shown in FIG. 2(C)) to form electrodes/interconnections 122 to 126 for the TFT by using a metallic material, for example, a multilayered film of titanium nitride and aluminum. Finally, annealing was performed in a hydrogen atmosphere at 1 atom at a temperature of 350° C. for 30 minutes. Alternatively, instead of effecting hydrogen annealing, hydrogen ions may be accelerated with an acceleration voltage of 10 to 100 keV and implanted into the active layer, followed by annealing. This step may be done during the steps shown in FIG. 1(C) or FIG. 1(D). (FIG. 1(F))

As mentioned above, circuit comprising TFTs was obtained. For example, an integrated circuit (a so-called monolithic active matrix circuit) having an active matrix circuit and the logic circuit for driving the active matrix circuit on the same substrate can be formed by using the N-channel type TFT and the P-channel type TFT formed in the island-like region 110, which are shown at left side in figure are arranged in a complementary circuit as mainly the logic circuit, and the TFT formed in the island region 111 shown at right side in figure is used as a switching transistor in an active matrix circuit.

As is apparent from FIG. 2(B), the channel region of the TFT according to the present example was provided to the crystallized regions 106 and 107 in the lateral growth at thermal treatment. The region yields excellent crystallinity, and hence, the electrical characteristics (for example, threshold voltage, field-effect mobility, and the like) could be fine. On the other hand, the region into which nickel was directly incorporated contained a higher concentration of nickel, and also the regions 108 and 109 are inferior in crystallinity. Hence, it is not preferable to form a channel region in these regions. However, the source, drain, and the like may be formed therein.

Example 2

The fabricating process according to the present example will be roughly described in FIG. 3. First, by a plasma CVD or the like, a silicon oxide film 202 was deposited on a glass substrate (Corning 7059, 10 cm×10 cm in size) 201 to a thickness of 1,000 to 5,000 Å, for example, 2000 Å as, a base film. Further, an amorphous silicon film 203 was deposited by plasma CVD or reduced pressure CVD to a thickness of 1,000 Å.

After forming a very thin silicon oxide film on the surface of the amorphous silicon film using aqueous hydrogen peroxide, 5 ml of an acetate solution containing 1-50 ppm, for example, 25 ppm of nickel was dropped in the same manner as in Example 1 (in the case of a substrate having 10 cm×10 cm in size). Further, at this time, spin-coating was effected at 50 rpm for a duration of 10 seconds to form a uniform aqueous film over the entire surface of the substrate. After further retaining this state for a duration of 5 minutes, spin-drying was effected for a duration of 60 seconds at 2,000 rpm using a spinner. The substrate may be retained with being rotated by the spinner at 0 to 150 rpm. A catalyst layer 204 containing nickel was formed in this manner as mentioned above. (FIG. 3(A))

Thereafter, a silicon nitride film 205 was deposited to a thickness of 500 to 3,000 Å, e.g. 1000 Å, through plasma CVD. Then, the amorphous silicon film 203 was crystallized by a heat treatment in a nitrogen atmosphere at a temperature of 550° C. for a duration of 4 hours. Since the nickel is formed between the amorphous silicon film 203 and the silicon nitride film 204, crystallization proceeded downwardly through the amorphous silicon film from the upper portion thereof. (FIG. 3(B))

After the crystallization step was performed by the above mentioned heat treatment, the crystallinity of the silicon film 12 was further improved by irradiating of an XeCl laser (a wavelength of 308 nm) through the silicon nitride film 205. In the laser beam irradiation process, it was possible to improve the uniformity and to lower the necessary laser energy density by heating the substrate or the laser irradiated surface. The preferable temperature range was around 200-450° C. As a result, the amorphous component in the silicon film can be completely crystallized to enhance the crystallinity. (FIG. 3(C))

This step can be effected by an RTA treatment. More specifically, infrared radiation of 0.6 to 4 μm wavelength, in the present example, an infrared radiation having a peak in the range of from 0.8 to 1.4 μm, was emitted for a duration of 30 to 180 seconds. Furthermore, hydrogen chloride may be included in the atmosphere at 0.1-10%.

A halogen lamp was used as the light source of the IR light. The intensity of the infrared radiation was controlled in such a manner that the temperature as measured on a single crystal silicon wafer used as a monitor is maintained within a range of 900 to 1,200° C. More specifically, the temperature detected by a thermocouple buried inside the silicon wafer was monitored, and the result was fed back to the infrared light source. In the present example, the temperature was raised at a constant rate of 50 to 200° C./second, and cooling was effected by natural cooling at a rate of 20 to 100° C./second. The substrate may be exposed to the JR light with the substrate temperature at a room temperature, however, the substrate is preferably heated previously to 200 to 450° C., for example 400° C. in order to make the irradiation of IR light more effective.

Then, the silicon nitride film 205 was removed, and the silicon film 203 was patterned to form silicon film regions 207 and 208 in an island-shape. The silicon film region is etched by a RIE method having anisotropy in perpendicular direction.

Thereafter, a silicon oxide film 209 having a 1,000 Å thick was deposited through a plasma CVD using TEOS (tetraethoxysilane) and oxygen as the starting materials for forming a gate insulating film. The temperature of the substrate during film deposition was 200 to 400° C., for example 350° C. Also, trichloroethylene (TCE) was added to the TEOS at the amount of 1 to 50%, typically 20%. Chlorine is introduced into the gate insulating film by the addition of the TCE so that mobile ions (such as sodium) can be removed from the active layer so as to improve an electrical characteristics of the device. Furthermore, the structure may be thermally annealed thereafter at a temperature of 550 to 650° C. in a nitrogen atmosphere or a dinitrogen monoxide, atmosphere. (FIG. 3(D))

Subsequently, an aluminum film (containing scandium at 0.1-2%) was deposited by sputtering to a thickness of 3,000 to 8,000 Å, for example, 4,000 Å. The aluminum film was patterned thereafter to provide gate electrodes 210 to 212. Further, the gate electrodes were anodically oxidized by applying a current thereto in an electrolytic solution to form an aluminum oxide film to a thickness of 1,000 to 3,000 Å, e.g. 2000 Å on the upper and side surfaces of the gate electrode. The anodic oxidation is performed in ethylene glycol solution containing a tartaric acid at 1-5%. The thickness of the aluminum oxide layer corresponds to the thickness of an offset gate region which is to be formed in the subsequent ion doping step so that the anodic oxidation process controls the length of an offset gate region.

Next, impurities for imparting either P or N-conductive type were added to the active layer region (comprising source/drain and channel) in a self-aligning manner by means of ion doping (also called as plasma doping) utilizing the gate electrode portion, that is, the gate electrode and surrounding oxide layer as a mask. As the doping gas, phosphine ($PH_3$) and diborane ($B_2H_6$) were used at an acceleration voltage of from 60 to 90 kV, for example 80 kV and from 40 to 80 kV, e.g. 65 kV, respectively. The dose was in the range of from $1\times10^{15}$ to $8\times10^{15}$ $cm^{-2}$. For example, phosphorus was implanted at a dose of $5\times10^{15}$ $cm^{-2}$, and boron was implanted at a dose of $2\times10^{15}$ $cm^{-2}$. At the doping process, the elements were each selectively doped by covering the one region with a photoresist. As a result, N-type impurity regions 214 and 215, and a P-type impurity region 213 were obtained to provide a P-channel type TFT (PTFT) region and an N-channel type TFT (NTFT) region.

Thereafter, annealing was performed by irradiation of a laser beam to activate ion-implanted impurities. As the laser beam, a KrF excimer laser (wavelength of 248, nm and a pulse width of 20 nsec) was used, however, it is possible to use other laser beams. The condition of the laser beam irradiation was 2 to 10 shots per site, for example, 2 shots per site, at an energy density of 200 to 400 $mJ/cm^2$, for example 250 $mJ/cm^2$. It is effective that the substrate was heated at 200-450° C. during the laser beam irradiation. Because nickel was diffused among the previously crystallized region by the laser annealing process, the recrystallization is easily proceeded by the laser irradiation and impurity regions 213 to 215 were easily activated. Instead of using the laser annealing, impurity may be activated by RTA method. (FIG. 3(E))

Subsequently, a silicon oxide film 216 having a 6,000 Å thick was deposited by plasma CVD as an interlayer insulator. Further, an ITO film having a 500 Å thick was deposited by sputtering and patterned to provide a pixel electrode 222. Contact holes were formed, in the interlayer insulator 216, and electrodes/wirings for TFT 217 to 221 were, formed by using a multilayered film of metallic materials such as titanium nitride and aluminum. Finally, the resulting structure was annealed in a hydrogen atmosphere at a pressure of 1 atom and a temperature of 350° C. for 30 minutes to complete TFT circuit. (FIG. 3(F))

Example 3

FIG. 4 shows the present example. A silicon oxide film 302 as a base file was deposited through plasma CVD to a thickness of 2,000 Å on a substrate (NH 35 glass substrate produced by NH Technoglass Co., Ltd) 301. After depositing the base film, the structure was annealed in a temperature range of from 620 to 660° C. for a duration of from 1 to 4 hours, and was gradually cooled at a rate of 0.1 to 1.0° C./minute, preferably from 0.1 to 0.3° C./minute. The substrate was taken out when the temperature was cooled to 450-590° C.

An amorphous silicon film 303 was deposited by plasma CVD to a thickness of 300 to 1,200 Å, e.g. 500 Å. Then, a nickel acetate layer 305 of 20 to 50 Å thick was formed by spin coating in the same manner as the foregoing Examples 1 and 2, using a mask 304 made of a silicon nitride film of 1,000 to 3,000 Å thick, e.g. 2,000 Å. As described in Example 1, it was necessary to form a very thin silicon oxide film on the surface of the exposed region of the amorphous silicon film before forming the nickel acetate layer. (FIG. 4(A))

Thereafter, the resulting structure was annealed at 600° C. for a duration of 4 hours in a nitrogen atmosphere to crystallize the silicon film 303. Similar to the case of Example 1, crystallization was found to initiate from the region in which nickel and the silicon film were brought into contact and proceed in the lateral direction. Referring to FIG. 4(B), the regions 306 and 307 correspond to the crystallized regions obtained in the present step, and the regions 308 and 309 were found to remain as they were in the form of amorphous silicon.

After completion of the heat treatment, the silicon nitride film 304 provided as the mask was removed. The crystallinity of the silicon film 303 was further improved by an irradiation with a KrF excimer laser. (FIG. 4(B))

Then, the silicon film 303 was patterned to provide island-like active layer regions 310 and 311. The active layer was etched using a perpendicularly anisotropic RIE method.

The surface of the active layer was oxidized to a thickness of 200 to 800 Å, typically 500 Å by exposing it to an 1 atm oxygen atmosphere containing 10% water vapor for 3 to 5 hour at 550-650° C., typically 600° C. As a result, silicon oxide films 312 and 313 were formed. The silicon oxide films were formed through a pyrogenic oxidation method (containing hydrogen and oxygen at a volume ratio of 1.8 to 1.0:1), which were advantageous, from the viewpoint of controllability of film thickness. The thickness of the silicon oxide films 312 and 313 thus obtained were 400 to 1,600 Å, and in the case of the present example, the thickness was 1,000 Å. After forming a silicon oxide film, hydrogen incorporated inside the silicon oxide film was removed by annealing the silicon oxide film at 600° C. in a dinitrogen monoxide atmosphere at 1 atom for 1 hour. (FIG. 4(C))

Subsequently, an aluminum film (containing scandium of 0.1 to 2%) was deposited to a thickness of 3,000 to 8,000 Å by sputtering, for example 5,000 Å. Then, the aluminum film was patterned thereafter to provide gate electrodes 314 to 316. The gate electrodes thus obtained were anodically oxidized in the same manner as in Example 2, by applying a current thereto in an electrolytic solution to form an aluminum oxide film having a 1,000 to 3,000 Å thickness, e.g. 2,000 Å on the upper and side surfaces of the gate electrodes.

Then, impurities for imparting either P- or N-conductivity to an active layer region (for comprising source/drain and channel) were added in a self-alignment manner by means of ion doping (also, called as plasma doping) utilizing the gate electrode, that is, the gate electrode and the surrounding oxide layer as a mask. As the doping gas, phosphine ($PH_3$) and diborane ($B_2H_6$) were used at an acceleration voltage of 60 to 90 kV, for example 80 kV and from 40 to 80 kV, e.g. 65 kV, respectively. The dose was in the range of from $1\times10^{15}$ to $8\times10^{15}$ cm$^{-2}$. For example, phosphorus was implanted at a dose of $5\times10^{15}$ cm$^{-2}$, and boron was implanted at a dose of $2\times10^{15}$ cm$^{-2}$. At the doping process, each element is selectively doped by covering one region with photoresist. Thus, N-type impurity regions 318 and 319, and P-type impurity regions 317 were formed to provide a P-channel TFT (PTFT) region and N-channel TFT (NTFT) regions.

The ion-implanted impurities were thereafter activated by annealing of laser beam. As the laser beam, a KrF excimer laser (a wavelength of 248 nm and a pulse width of 20 nsec) was used.

Then, a silicon oxide film 320 was deposited by plasma CVD. This film must exhibit excellent coverage on the side surfaces of the gate electrode. The film has a thickness of 0.5 to 1 μm, for example 0.7 μm. (FIG. 4(D))

Then, the insulating coating thus obtained was anisotropically etched by means of dry etching and the like. More specifically, etching was performed selectively along the perpendicular direction. As a result, the surface of the source/drain regions was exposed, while leaving approximately triangular insulators 321, 322, and 323 on the sides of each gate electrodes (surrounding anodic oxide layers are included).

The size, particularly the width, of the approximately triangular insulators 321 to 323 depends on the thickness of the previously deposited silicon oxide film 320, etching conditions, and the height of the gate electrode (surrounding anodic oxide layers are included). The insulators 321 to 323 thus obtained are not necessarily in a triangular shape, but shape is changed depending on the step coverage and the film thickness of the silicon oxide film 320. For example, rectangular insulators were formed if the thickness is small.

A titanium film 324 was then formed at a thickness of 5 to 50 nm by means of sputtering. Materials other than titanium, such as molybdenum, tungsten, platinum, or palladium, could also be used. (FIG. 4(E))

The film thus deposited was annealed at a temperature of 200 to 650° C., preferably 400 to 500° C., to allow the titanium film to react with, silicon constituting the source/drain regions. Silicide layers 325, 326, and 327' were formed on the source/drain regions.

The non-reacted titanium film (remaining mainly on the silicon oxide or on the anodically oxidized film) was etched thereafter. A silicon oxide film was deposited to a thickness of 6000 Å as an interlayer insulator 328 over the entire surface by a CVD. Further an ITO film was deposited by sputtering to a thickness of 500 to 1,000 Å, and was patterned to provide a pixel electrode 329. Then, as shown in FIG. 4(F), contact holes were formed in the source/drain of the TFT, following which a multilayered film of titanium nitride and aluminum were patterned to form electrodes/wirings 330 to 334 of the second layer. The thickness of the titanium nitride is 800 Å and that of aluminum layer is 5,000 Å. Finally, the resulting structure was annealed in a hydrogen atmosphere at 1 atm at 350° C. for 30 minutes to complete a TFT circuit. (FIG. 4(F))

Effect of the Invention

The present invention provides a silicon film having excellent crystallinity with high reliability. The crystalline silicon film thus obtained according to the present invention is suitable for use in the fabrication of a TFT as shown in the examples. For example, when TFT was fabricated by using a crystalline silicon film produced by a conventional SPC process, an N-channel type TFT (i.e. a TFT comprising an N-type conductive source and drain) has a field effect mobility μ in the range of 50 to 60 cm$^2$/Vs at best. This field effect mobility was improved to a range of 90 to 100 cm$^2$/Vs by adding a catalyst element such as nickel and thereby promoting the growth in the lateral direction. However, the value of μ in Example 3 according to the present invention could be improved in the range of 150 to 200 cm$^2$/Vs.

Furthermore, the threshold voltage was obtained in the range of from +3 to +7 V by conventional processes, on the other hand, the range of 0 to +1 V was obtained by the present invention. The improvement in the threshold voltage is particularly remarkable in a P-channel type TFT, in which the absolute value of the threshold voltage is found to drop from the conventional range of from 6 to 10 V to a range: of from 0 to 2 V. These effects result from the fact that the silicon films are formed without being oriented along the (111) plane, because the amorphous silicon film is crystallized with silicon nitride in contact therewith. As a result, in the case of fabricating a complementary circuit by combining an N-channel type TFT with a P-channel type TFT, the circuit can be driven at a lower voltage because the difference in threshold voltage in each of the TFTs can be reduced. Thus, a far more reliable circuit can be implemented.

It can be seen from the foregoing that the present invention is industrially contributory in various aspects.

DESCRIPTION OF REMARKS

Figure 1A:
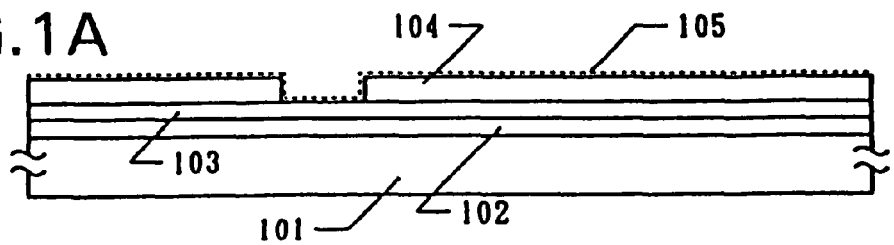
FIG. 1A-1F shows a manufacturing step in accordance with the first embodiment of the present invention (cross section).
Figure 1B:
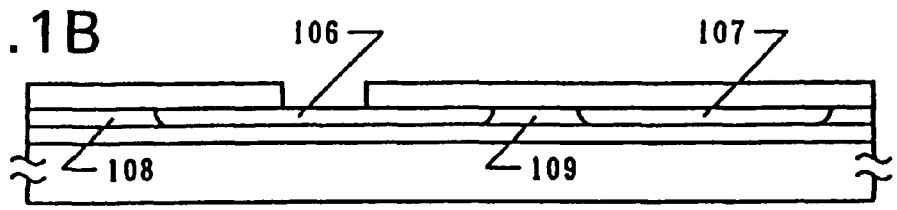
Figure 1C:
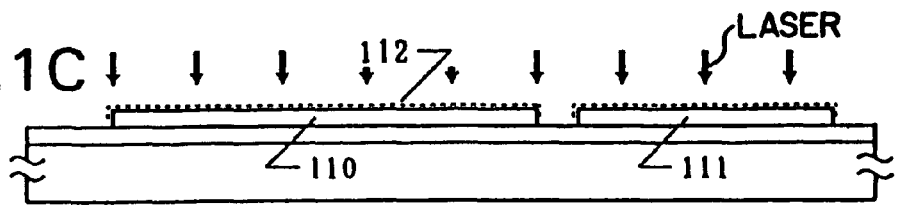
Figure 1D:
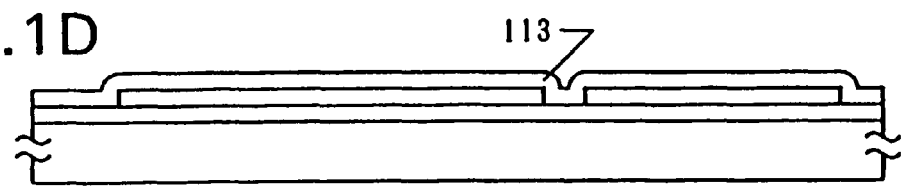
Figure 1E:
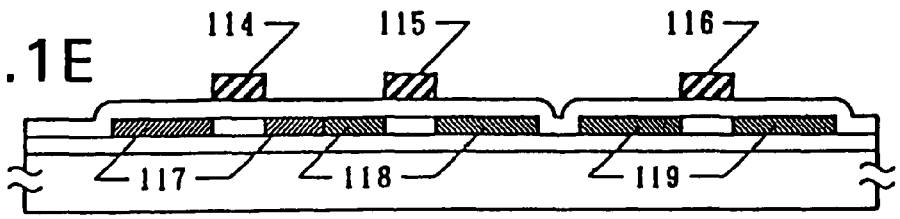
Figure 1F:
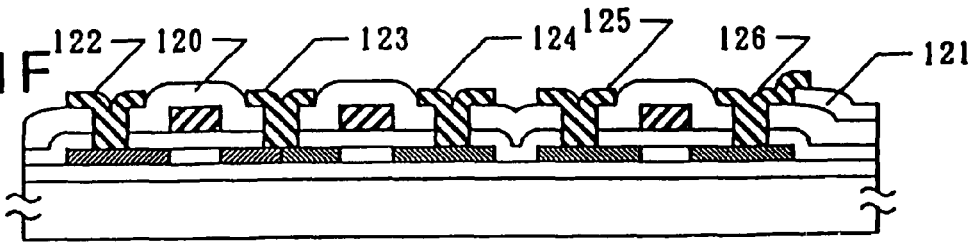
Figure 2A:
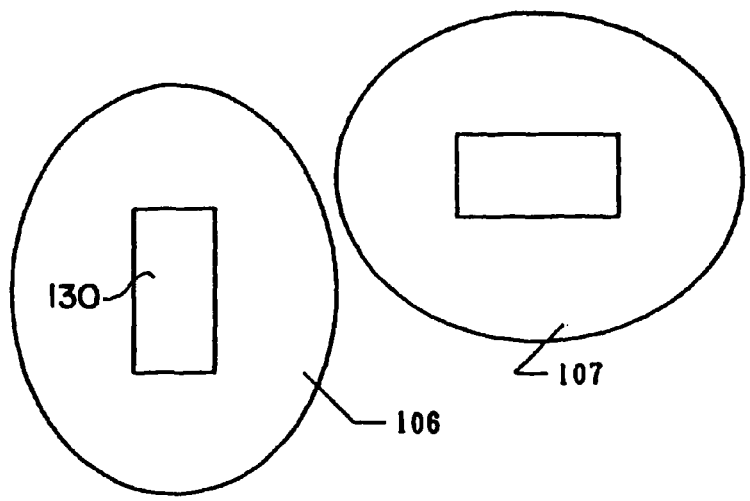
FIGS. 2A-2C shows a manufacturing step in accordance with the first embodiment of the present invention (upper view).
Figure 2B:
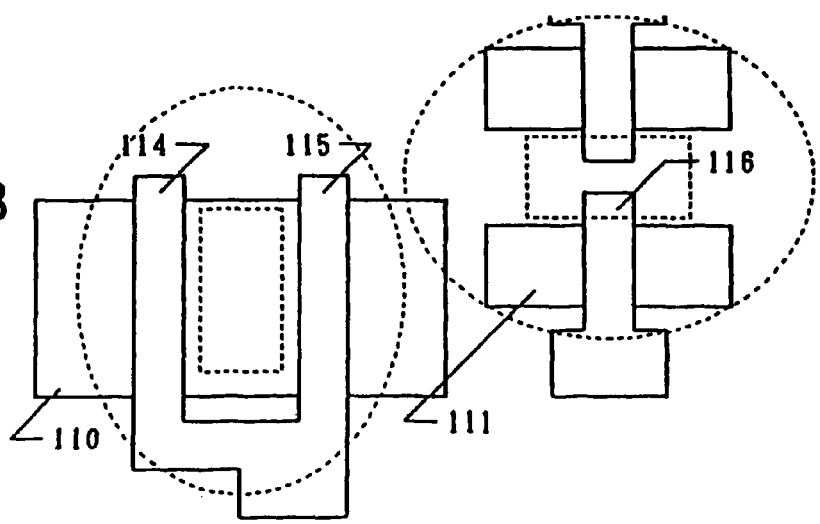
Figure 2C:
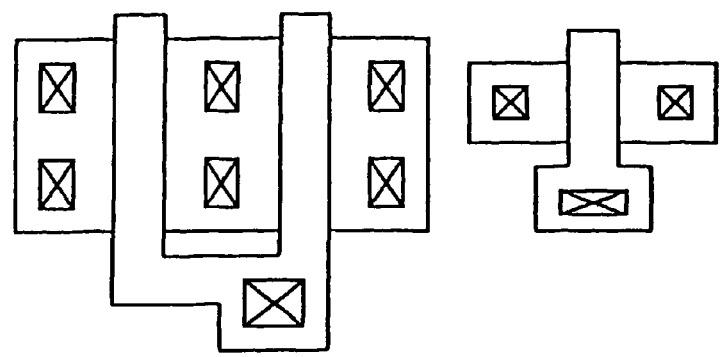
Figure 3A:
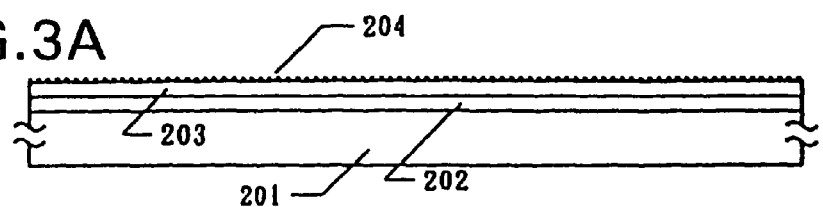
FIGS. 3A-3F shows a manufacturing step in accordance with the second embodiment of the present invention (cross section).
Figure 3B:
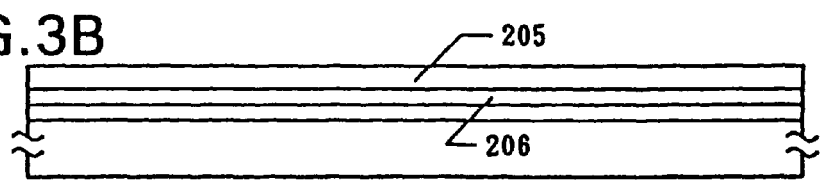
Figure 3C:
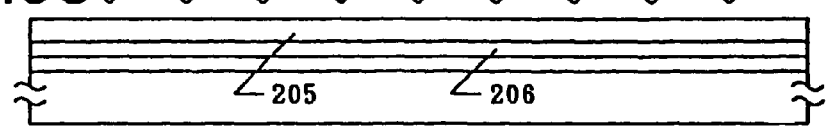
Figure 3D:
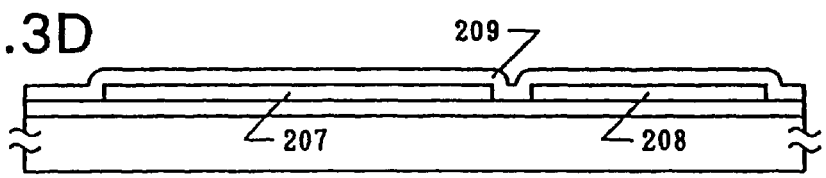
Figure 3E:
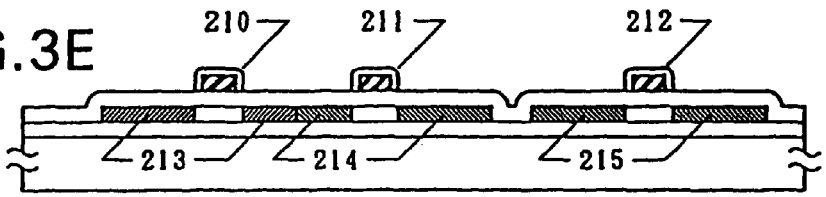
Figure 3F:
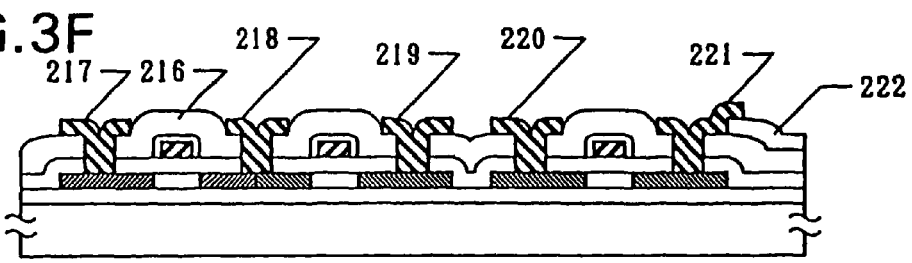
Figure 4A:
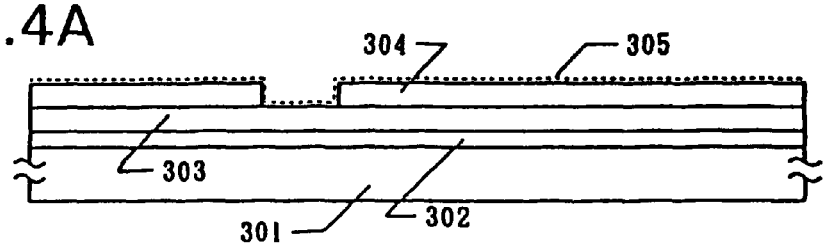
FIGS. 4A-4F shows a manufacturing step in accordance with the third embodiment of the present invention (cross section).
Figure 4B:
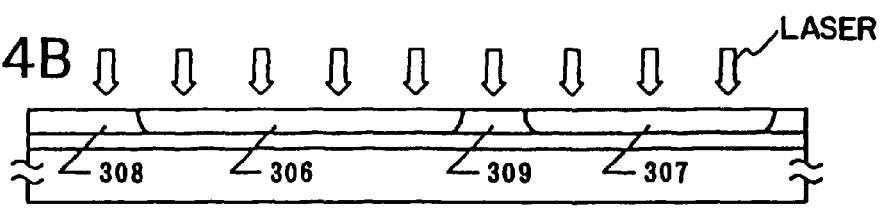
Figure 4C:
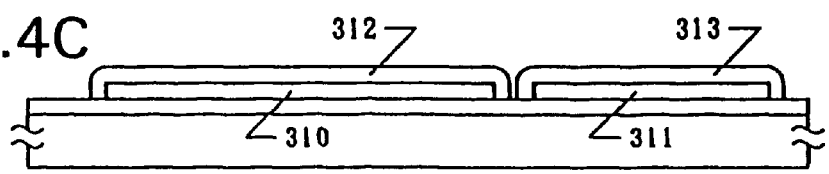
Figure 4D:
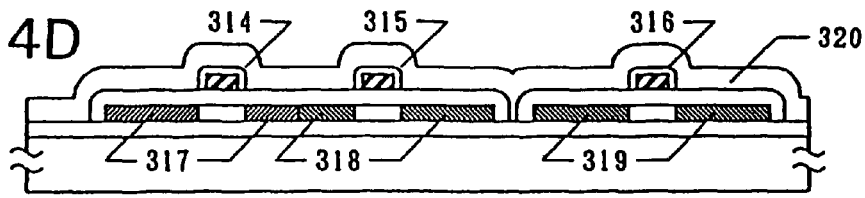
Figure 4E:
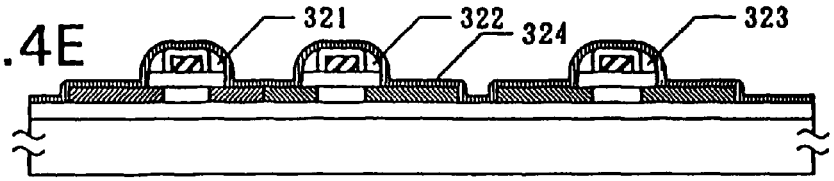
Figure 4F:
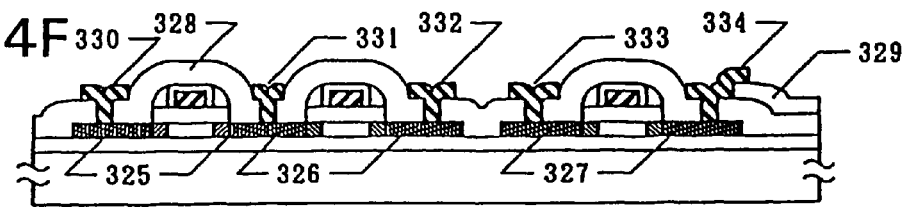

101 . . . glass substrate
102 . . . base film (silicon nitride)
103 . . . amorphous silicon film
104 . . . mask film (silicon oxide)
105 . . . catalyst layer (acetate nickel)
106, 107 . . . crystallized region
108, 109 . . . not crystallized region
110, 111 . . . silicon film region in island shape
112 . . . silicon oxide film formed by thermal oxidation
113 . . . gale insulating film (silicon oxide)
114 to 116 . . . gate electrode (silicon doped with phosphorus)
117 . . . P type region (source/drain)
118, 119 . . . N type region (source/drain)
120 . . . interlayer insulator (silicon oxide)
121 . . . pixel electrode (ITO)
122 to 126 . . . metallic electrode (TiN/Al)

What is claimed is:

1. A method of manufacturing a semiconductor device comprising the steps of:
    forming a semiconductor film comprising an amorphous silicon over a substrate; forming
    a silicon oxide film on the semiconductor film;
    disposing a solution containing a metal being capable of promoting crystallization of the semiconductor film;
    forming a silicon nitride film over the silicon oxide film; and
    heating the semiconductor film and the metal to crystallize the semiconductor film.

2. A method according to claim 1, wherein the silicon nitride film comprises at least one of hydrogen and oxygen.

3. A method according to claim 1, wherein the silicon nitride is formed by a plasma CVD system or an LPCVD system.

4. A method according to claim 1, wherein the metal is selected from the group consisting of nickel, palladium, platinum, copper, silver, gold, indium, tin, phosphorous, arsenic and antimony.

5. A method according to claim 1, wherein the silicon nitride film is in contact with the semiconductor film.

6. A method of manufacturing a semiconductor device comprising the steps of:
    forming a semiconductor film comprising an amorphous silicon over a substrate; forming
    a silicon oxide film on the semiconductor film;
    disposing a solution containing a metal being capable of promoting crystallization of the semiconductor film;
    forming a silicon nitride film over the silicon oxide film;
    heating the semiconductor film and the metal to crystallize the semiconductor film; and
    irradiating the semiconductor film with a laser beam.

7. A method according to claim 6, wherein the silicon nitride film comprises at least one of hydrogen and oxygen.

8. A method according to claim 6, wherein the silicon nitride is formed by a plasma CVD system or an LPCVD system.

9. A method according to claim 6, wherein the metal is selected from the group consisting of nickel, palladium, platinum, copper, silver, gold, indium, tin, phosphorous, arsenic and antimony.

10. A method according to claim 6, wherein the silicon nitride film is in contact with the semiconductor film.

11. A method of manufacturing a semiconductor device comprising the steps of:
    forming a semiconductor film comprising an amorphous silicon over a substrate;
    forming a silicon oxide film on the semiconductor film;
    disposing a solution containing a metal being capable of promoting crystallization of the semiconductor film;
    forming a silicon nitride film over the silicon oxide film;
    heating the semiconductor film and the metal to crystallize the semiconductor film;
    irradiating the semiconductor film with a laser beam; and
    removing the silicon nitride film.

12. A method according to claim 11, wherein the silicon nitride film comprises at least one of hydrogen and oxygen.

13. A method according to claim 11, wherein the silicon nitride is formed by a plasma CVD system or an LPCVD system.

14. A method according to claim 11, wherein the metal is selected from the group consisting of nickel, palladium, platinum, copper, silver, gold, indium, tin, phosphorous, arsenic and antimony.

15. A method according to claim 11, wherein the silicon nitride film is in contact with the semiconductor film.

16. A method of manufacturing a semiconductor device comprising the steps of:
    forming a semiconductor film comprising an amorphous silicon over a substrate;
    forming a silicon oxide film on the semiconductor film;
    disposing a solution containing a metal being capable of promoting crystallization of the semiconductor film;
    forming a silicon nitride film over the silicon oxide film; and
    heating the semiconductor film, the metal and the silicon nitride film to crystallize the semiconductor film.

17. A method according to claim 16, wherein the silicon nitride film comprises at least one of hydrogen and oxygen.

18. A method according to claim 16, wherein the silicon nitride is formed by a plasma CVD system or an LPCVD system.

19. A method according to claim 16, wherein the metal is selected from the group consisting of nickel, palladium, platinum, copper, silver, gold, indium, tin, phosphorous, arsenic and antimony.

20. A method according to claim 16, wherein the silicon nitride film is in contact with the semiconductor film.

* * * * *

UNITED STATES PATENT AND TRADEMARK OFFICE
CERTIFICATE OF CORRECTION

PATENT NO. : 7,749,819 B2
APPLICATION NO. : 11/808035
DATED : July 6, 2010
INVENTOR(S) : Hisashi Ohtani et al.

It is certified that error appears in the above-identified patent and that said Letters Patent is hereby corrected as shown below:

column 2, line 46, "the silicon films" should read "the silicon film"

column 2, line 57, "as "a catalyst layer" hereinafter." should read "as "a catalyst layer", hereinafter."

column 3, line 9, "and" should be omitted column 3, line 12, "a catalyst layer, on" should read "a catalyst layer on"

column 3, line 28, "entire, surface" should read "entire surface"

column 4, line 9, "high, reliability" should read "high reliability"

column 6, line 32, "obtained, on" should read "obtained on"

column 6, line 51, "III" should read "111"

column 7, line 26, "close" should read "dose"

column 8, line 25 "as, a" should read "as a"

column 9, line 13, "JR" should "IR"

column 10, line 3, "248, nm" should read "248 nm"

column 10, line 19, "formed, in" should read "formed in"

column 10, line 12, "were, formed" should read "were formed"

column 10, line 67, "hour" should read "hours"

column 12, line 1, "with, silicon" should read "with silicon"

column 12, line 2, "327'" should read "327"

column 12, line 41, "range:of" should read "range of"

column 12, line 56, "FIG." should read "FIGS."

column 12, line 56, "shows" should read "show"

column 12, line 58, "shows" should read "show"

column 12, line 60, "shows" should read "show"

column 12, line 63, "shows" should read "show"

Signed and Sealed this
Twenty-third Day of August, 2011

David J. Kappos
*Director of the United States Patent and Trademark Office*